United States Patent [19]

Kashiwaya

[11] Patent Number: 5,698,312
[45] Date of Patent: Dec. 16, 1997

[54] MAGNETO-OPTICAL RECORDING MEDIUM AND METHOD FOR MAKING THE SAME

[75] Inventor: Makoto Kashiwaya, Kanagawa-ken, Japan

[73] Assignee: Fuji Photo Film Co., Ltd., Kanagawa, Japan

[21] Appl. No.: 673,382

[22] Filed: Mar. 22, 1991

[30] Foreign Application Priority Data

Mar. 22, 1990 [JP] Japan ............ 2-73083
Mar. 30, 1990 [JP] Japan ............ 2-83699
Apr. 2, 1990 [JP] Japan ............ 2-8079

[51] Int. Cl.$^6$ ............ G11B 5/66; C23C 14/00
[52] U.S. Cl. ............ 428/332; 428/336; 428/694 ML; 428/694 DE; 428/694 RL; 428/694 RE; 428/694 MT; 428/900; 204/192.1; 204/192.14; 204/192.15; 204/192.16; 204/192.2; 204/192.26; 204/192.27
[58] Field of Search ............ 204/192.27, 192.1, 204/192.14, 192.15, 192.2, 192.16, 192.26; 428/694, 900, 332, 336, 694 ML, 694 DE, 694 RL, 694 RE, 694 MT

[56] References Cited

U.S. PATENT DOCUMENTS

| | | | |
|---|---|---|---|
| 4,125,446 | 11/1978 | Hartsough et al. | 204/192.27 |
| 4,444,635 | 4/1984 | Kobayashi | 204/192.15 |
| 4,680,742 | 7/1987 | Yamada et al. | 369/13 |
| 4,719,137 | 1/1988 | Ohta et al. | 428/67 |

FOREIGN PATENT DOCUMENTS 192256  8/1986  European Pat. Off. .

*Primary Examiner*—Leszek Kiliman
*Attorney, Agent, or Firm*—Sixbey, Friedman, Leedom & Ferguson, P.C.; Gerald J. Ferguson, Jr.; Joan K. Lawrence

[57] ABSTRACT

A magneto-optical recording medium comprises a recording layer and a reflection metal layer, which are overlaid in this order on a transparent substrate. The reflection metal layer primarily contains Al or an alloy of Al and is formed by carrying out a sputtering process in an atmosphere, in which the content of residual hydrogen gas is not higher than 10,000 ppm with respect to the amount of an inert gas. Alternatively, a recording layer is formed by carrying out a sputtering process in an inert gas atmosphere, in which the content of residual hydrogen gas is not higher than 1,000 ppm with respect to the amount of an inert gas. As another alternative, a magneto-optical recording medium comprises a first protective dielectric layer, a recording layer, and a second protective dielectric layer, which are overlaid in this order on a transparent substrate. The first protective dielectric layer and/or the second protective dielectric layer is formed by carrying out a sputtering process in an inert gas atmosphere, in which the content of residual hydrogen gas is not higher than 1,000 ppm with respect to the amount of an inert gas.

22 Claims, No Drawings

MAGNETO-OPTICAL RECORDING MEDIUM AND METHOD FOR MAKING THE SAME

BACKGROUND OF THE INVENTION

1. Field of the Invention

This invention relates to a magneto-optical recording medium exhibiting excellent bias magnetic field characteristics and excellent durability against operations for erasing, writing, and reproducing information. This invention also relates to a method for making the magneto-optical recording medium.

2. Description of the Prior Art

In recent years, magneto-optical recording media have been used widely in the form of magneto-optical disks, which are used for large-capacity information storage, or the like, and which enable the writing and reading of information using a laser beam.

One example of the magneto-optical recording medium comprises a transparent substrate, which may be constituted of glass, a plastic material, or the like, and a magneto-optical recording film, which is composed of three or four layers and is overlaid on the transparent substrate. The three-layer magneto-optical recording film is composed of a first protective dielectric layer (enhancing layer), a recording layer, and a reflection metal layer, which are overlaid in this order on the transparent substrate with a sputtering process or the like. The four-layer magneto-optical recording film is composed of a first protective dielectric layer (enhancing layer), a recording layer, a second protective dielectric layer, and a reflection metal layer, which are overlaid in this order on the transparent substrate with a sputtering process or the like. The first protective dielectric layer (enhancing layer) is constituted of $Si_3N_4$, $SiO_2$, SiAlN, or the like. The recording layer primarily contains at least one transition metal and at least one rare earth metal. For example, the recording layer may be primarily constituted of TbFeCo or GdTbFeCo. The reflection metal layer is constituted of Al, Al—Ti, Al—Ta, or the like. Such a magneto-optical recording medium has heretofore been used widely because it exhibits a high C/N ratio.

Also, the recording layer of the magneto-optical recording medium is composed of a single layer of an alloy of, primarily, at least one rare earth metal and at least one transition metal. Alternatively, the recording layer is composed of at least two films, which are primarily constituted of at least one rare earth metal and each of which has a thickness falling within the range of several angstroms to several tens of angstroms, and at least two films, which are primarily constituted of at least one transition metal and each of which has a thickness falling within the range of several angstroms to several tens of angstroms. These films constituting the recording layer are overlaid alternately.

Also, a double-faced type of magneto-optical recording medium has been proposed, which comprises two magneto-optical recording media each having a magneto-optical recording film overlaid on a transparent substrate. Specifically, the two magneto-optical recording media are laminated via an adhesive layer such that their transparent substrates face outward and their magneto-optical recording films face each other via the adhesive layer.

Ordinarily, each of the layers constituting a magneto-optical recording film is formed with a sputtering process in a low-pressure inert gas atmosphere. In the sputtering process, at least one target is used which is constituted of at least one metal for constituting each layer. Each of the layers constituting a magneto-optical recording film has a thickness falling within the range of several hundreds of angstroms to several thousands of angstroms.

When information is to be recorded on a magneto-optical recording medium, on which information has already been recorded, an erasing bias magnetic field is applied to the magneto-optical recording medium, and at the same time a laser beam is uniformly irradiated to the magneto-optical recording medium in order to heat it at the Curie temperature of its recording layer. In this manner, information, which was previously recorded on the magneto-optical recording medium, is erased. Also, a bias magnetic field is applied from the exterior to the magneto-optical recording medium, and the recording layer of the magneto-optical recording medium is thereby magnetized in a predetermined orientation. Thereafter, a writing bias magnetic field, which has an intensity, Hb, is applied to the magneto-optical recording medium, and at the same time a laser beam is irradiated to the magneto-optical recording medium. In this manner, information is recorded on the magneto-optical recording medium.

In general, the C/N ratio is proportional to the intensity of the bias magnetic field, Hb. However, the change in the C/N ratio is saturated at a certain intensity of the bias magnetic field, i.e. the intensity of the saturation bias magnetic field, Hbs. A magneto-optical recording medium has its intrinsic intensity of the saturation bias magnetic field, Hbs. When a magneto-optical recording medium having a low intensity of the saturation bias magnetic field, Hbs, is used, information can be erased and written on the magneto-optical recording medium by the application of a bias magnetic field having a low intensity. Also, when intensity of the bias magnetic field applied is the same, a magneto-optical recording medium, which has a low intensity of the saturation bias magnetic field, Hbs, exhibits a higher C/N ratio than a magneto-optical recording medium, which has a high intensity of the saturation bias magnetic field, Hbs. Therefore, a magneto-optical recording medium, which has a low intensity of the saturation bias magnetic field, Hbs, is advantageous over a magneto-optical recording medium, which has a high intensity of the saturation bias magnetic field, Hbs.

If the intensity of the bias magnetic field, Hb, which is necessary during the erasing and the writing of information, is low, a magnet used to apply the bias magnetic field can be kept small in size. Therefore, a magneto-optical recording medium, on which information can be erased and written at a low intensity of the bias magnetic field, Hb, is advantageous from the point of view of keeping the apparatus for driving the magneto-optical recording medium small in size.

Also, recently, magneto-optical recording media are used in various ways. For example, it is desired that overwriting of information can be carried out on magneto-optical recording media. In cases where information is overwritten on a magneto-optical recording medium, in order that the magneto-optical recording apparatus may be kept small in size and the access time may be kept short, the intensity of the bias magnetic field, Hb, which is necessary during the erasing and the writing of information, must be low.

However, it is difficult for a magneto-optical recording medium to be obtained which exhibits stable characteristics with respect to the intensity of the bias magnetic field, Hb, which is necessary during the erasing and the writing of information. Actually, the intensity of the bias magnetic field, Hb, which is necessary during the erasing and the writing of information, varies over the range of 100 to 700

Oe (oersted) for different samples of a conventional magneto-optical recording medium. For practical use of a magneto-optical recording medium, it should exhibit stable characteristics such that the intensity of the bias magnetic field, Hb, which is necessary during the erasing and the writing of information, falls within the range of 100 to 500 Oe, and preferably within the range of 200 to 300 Oe. However, actually, with a conventional method for making a magneto-optical recording medium, a magneto-optical recording medium is obtained which exhibits larger amounts of variations in the intensity of the bias magnetic field, Hb, which is necessary during the erasing and the writing of information. Thus with a conventional method for making a magneto-optical recording medium, it is difficult for a magneto-optical recording medium exhibiting excellent bias magnetic field characteristics to be obtained consistently.

Various attempts have heretofore been made to control the bias magnetic field characteristics of a magneto-optical recording medium. For example, in cases where the recording layer of a magneto-optical recording medium is constituted of a transition metal and a rare earth metal, it has been proposed to change the proportions of the transition metal and the rare earth metal with respect to each other, or to add different metals to the recording layer. Such techniques are described in, for example, MAG-87-177; J. Appl. Phys., 61 (7), 1987; J. Appl. Phys., 26 (2), 1987; and J. Appl. Phys., 61 (8), 1987. However, with such conventional techniques, a magneto-optical recording medium is obtained which exhibits large amounts of variations in the intensity of the bias magnetic field, Hb, which is necessary during the erasing and the writing of information. Specifically, the necessary intensity of the bias magnetic field, Hb, varies over the range of 100 to 700 Oe for different samples of a magneto-optical recording medium, which is made with each of the conventional techniques.

A magneto-optical recording medium is also required to exhibit excellent durability against repeated operations for erasing, writing, and reproducing information. (The durability against repeated operations for erasing, writing, and reproducing information will hereinbelow be referred to as the EWR characteristics.) Specifically, it is desired that the characteristics of a magneto-optical recording medium may not deteriorate when the magneto-optical recording medium is repeatedly used many times (e.g. tens of thousands of times). The EWR characteristics are rated in terms of the extent of a decrease in the C/N ratio, which decrease occurs when the operations for erasing, writing, and reproducing information are repeated on the same part of the magneto-optical recording film of a magneto-optical recording medium. In general, it is desired that the extent of a decrease in the C/N ratio may be less than 4 dB when the operations for erasing, writing, and reproducing information are repeated 100,000 times on the same part of the magneto-optical recording film of a magneto-optical recording medium. In cases where the recording layer is composed of at least two rare earth metal films and at least two transition metal films, which are alternately overlaid, the EWR characteristics can be improved to some extent by keeping the cycle, with which the rare earth metal films and the transition metal films are alternately overlaid, short.

However, with the technique for improving the EWR characteristics by keeping the cycle, with which the rare earth metal films and the transition metal films are alternately overlaid, short, the EWR characteristics cannot be kept sufficiently high. With this technique, it often occurs that the C/N ratio decreases by more than 4 dB when the operations for erasing, writing, and reproducing information are repeated as many as 100,000 times on the same part of the magneto-optical recording film of the magneto-optical recording medium.

Also, the EWR characteristics vary considerably for different samples of a magneto-optical recording medium, which have the same composition.

SUMMARY OF THE INVENTION

The primary object of the present invention is to provide a magneto-optical recording medium, which exhibits both excellent bias magnetic field characteristics and excellent EWR characteristics.

Another object of the present invention is to provide a magneto-optical recording medium, which exhibits little variation in the bias magnetic field characteristics and little variation in the EWR characteristics.

The specific object of the present invention is to provide a method for making the magneto-optical recording medium.

The inventor carried out extensive research with respect to the conditions, under which each of layers constituting a magneto-optical recording film is formed on a transparent substrate. It was thereby found that the content of a specific gas, which remains in a sputtering chamber of a sputtering apparatus in the course of forming a reflection metal layer, a recording layer, a first protective dielectric layer, or a second protective dielectric layer, serves as an important factor for accomplishing the objects of the present invention. The present invention is based on these findings.

Specifically, the present invention provides a first magneto-optical recording medium at least comprising a transparent substrate, a recording layer which is overlaid at least on one surface of the transparent substrate, and a reflection metal layer which is overlaid on the recording layer, wherein said reflection metal layer primarily contains Al or an alloy of Al and is formed by carrying out a sputtering process in an atmosphere, in which the content of residual hydrogen gas is not higher than 10,000 ppm with respect to the amount of an inert gas.

In the first magneto-optical recording medium in accordance with the present invention, the reflection metal layer should preferably be formed by carrying out a sputtering process in an atmosphere, in which the content of residual hydrogen gas is not higher than 10,000 ppm with respect to the amount of an inert gas, and the content of residual nitrogen gas is not higher than 1,000 ppm with respect to the amount of the inert gas.

The present invention also provides a first method for making a magneto-optical recording medium, which comprises the steps of:

i) forming a recording layer on a transparent substrate by carrying out a sputtering process in an atmosphere, which contains an inert gas at a low pressure, and ii) thereafter forming a reflection metal layer on said recording layer by carrying out a sputtering process in an atmosphere, in which the content of residual hydrogen gas is not higher than 10,000 ppm with respect to the amount of the inert gas.

In the first method for making a magneto-optical recording medium in accordance with the present invention, the reflection metal layer should preferably be formed by carrying out a sputtering process in an atmosphere, in which the content of residual hydrogen gas is not higher than 10,000 ppm with respect to the amount of an inert gas, and the content of residual nitrogen gas is not higher than 1,000 ppm with respect to the amount of the inert gas.

With the first method for making a magneto-optical recording medium in accordance with the present invention, a magneto-optical recording medium is made which at least comprises a transparent substrate, a recording layer overlaid at least on one surface of the transparent substrate, and a reflection metal layer overlaid on the recording layer. In the course of forming the reflection metal layer by a sputtering process, the content of residual hydrogen gas in the gas atmosphere in the sputtering chamber is kept at a level not higher than the specific level. Alternatively, both the content of residual hydrogen gas and the content of residual nitrogen gas in the gas atmosphere in the sputtering chamber are kept at levels not higher than the specific levels. Therefore, a magneto-optical recording medium can be obtained, which exhibits both excellent bias magnetic field characteristics and excellent EWR characteristics. Also, a magneto-optical recording medium can be obtained, which exhibits little variation in the bias magnetic field characteristics and little variation in the EWR characteristics.

The present invention further provides a second magneto-optical recording medium at least comprising a transparent substrate and a recording layer which is overlaid at least on one surface of the transparent substrate, wherein said recording layer is formed by carrying out a sputtering process in an inert gas atmosphere, in which the content of residual hydrogen gas is not higher than 1,000 ppm with respect to the amount of an inert gas.

In the second magneto-optical recording medium in accordance with the present invention, the recording layer should preferably be formed by carrying out a sputtering process in an inert gas atmosphere, in which the content of residual hydrogen gas is not higher than 1,000 ppm with respect to the amount of an inert gas, and the content of residual nitrogen gas is not higher than 1,000 ppm with respect to the amount of the inert gas.

The present invention still further provides a second method for making a magneto-optical recording medium, which comprises the steps of:

i) keeping the content of residual hydrogen gas in a low-pressure inert gas atmosphere at a value, which is not higher than 1,000 ppm with respect to the amount of an inert gas, and
ii) sputtering at least one magnetic material from the corresponding magnetic material target to a transparent substrate in said low-pressure inert gas atmosphere, whereby a recording layer is formed on said transparent substrate.

In the second method for making a magneto-optical recording medium in accordance with the present invention, in the course of forming the recording layer, the content of residual hydrogen gas in the low-pressure inert gas atmosphere is kept at a value, which is not higher than 1,000 ppm with respect to the amount of an inert gas. At the same time, the content of residual nitrogen gas in the low-pressure inert gas atmosphere should preferably be kept at a value, which is not higher than 1,000 ppm with respect to the amount of the inert gas.

With the second method for making a magneto-optical recording medium in accordance with the present invention, in the course of forming the recording layer of a magneto-optical recording film on the transparent substrate by a sputtering process, the content of residual hydrogen gas in the gas atmosphere in the sputtering chamber is kept at a level not higher than the specific level. Alternatively, both the content of residual hydrogen gas and the content of residual nitrogen gas in the gas atmosphere in the sputtering chamber are kept at levels not higher than the specific levels. Therefore, a magneto-optical recording medium can be obtained, which exhibits both excellent bias magnetic field characteristics and excellent EWR characteristics. Also, a magneto-optical recording medium can be obtained, which exhibits little variation in the bias magnetic field characteristics and little variation in the EWR characteristics.

The present invention also provides a third magneto-optical recording medium comprising a transparent substrate and a magneto-optical recording film overlaid on the transparent substrate, the magneto-optical recording film being composed of at least a first protective dielectric layer, a recording layer, and a second protective dielectric layer, which are overlaid in this order on the transparent substrate, wherein at least either one of said first protective dielectric layer and said second protective dielectric layer is formed by carrying out a sputtering process in an inert gas atmosphere, in which the content of residual hydrogen gas is not higher than 1,000 ppm with respect to the amount of an inert gas.

The present invention further provides a third method for making a magneto-optical recording medium, in which at least a recording layer and a protective dielectric layer are formed on a transparent substrate with a sputtering process, wherein the improvement comprises the steps of, in the course of forming said protective dielectric layer:

i) keeping the content of residual hydrogen gas in a low-pressure inert gas atmosphere at a value, which is not higher than 1,000 ppm with respect to the amount of an inert gas, and
ii) sputtering a dielectric from a dielectric target to said transparent substrate in said low-pressure inert gas atmosphere by applying an electric power to said dielectric target, whereby a dielectric layer is formed on said transparent substrate.

With the third method for making a magneto-optical recording medium in accordance with the present invention, in the course of forming the first protective dielectric layer and/or the second protective dielectric layer of a magneto-optical recording film during the process for forming the magneto-optical recording film on the transparent substrate by a sputtering process, the content of residual hydrogen gas in the gas atmosphere in the sputtering chamber is kept at a level not higher than the specific level. Therefore, a magneto-optical recording medium can be obtained, which exhibits both excellent bias magnetic field characteristics and excellent EWR characteristics. Also, a magneto-optical recording medium can be obtained, which exhibits little variation in the bias magnetic field characteristics and little variation in the EWR characteristics.

DETAILED DESCRIPTION OF THE INVENTION

The magneto-optical recording film of the first magneto-optical recording medium in accordance with the present invention is formed with the sputtering process. Ordinarily, the magneto-optical recording film is formed in an atmosphere containing an inert gas, such as Ar gas, He gas, or Ne gas, at a low pressure falling within the range of $1 \times 10^{-3}$ to $20 \times 10-3$ Torr in a sputtering chamber. In a vacuum chamber, which has been evacuated and into which an inert gas has been introduced, various gases other than the inert gas remain unremoved. For example, nitrogen gas, moisture, hydrogen gas, and oxygen gas remain unremoved in the sputtering chamber. Atomic groups, such as CH and OH, also remain in the sputtering chamber. Among various gases other than the inert gas, which remain in the inert gas atmosphere in the course of forming the reflection metal layer on the recording layer after the recording layer has been formed on the transparent substrate, in particular, the content of residual hydrogen gas should be kept at a level not higher than a specific level with respect to the amount of the inert gas. Keeping the content of residual hydrogen gas at a level not higher than the specific level with respect to the amount of the inert gas in the course of forming the reflection metal layer is important in order for the first magneto-optical recording medium in accordance with the present invention, which exhibits excellent and stable bias magnetic field characteristics and excellent and stable EWR characteristics, to be obtained. In order for larger effects of the first magneto-optical recording medium in accordance with the present invention to be obtained, the content of residual nitrogen gas should also be kept at a level not higher than the specific level with respect to the amount of the inert gas in the course of forming the reflection metal layer. Also, particularly large effects of the first magneto-optical recording medium in accordance with the present invention can be obtained when the reflection metal layer primarily contains Al or an alloy of Al, and the recording layer primarily contains an alloy of at least one rare earth metal and at least one transition metal.

Therefore, in the first magneto-optical recording medium and the first method for making a magneto-optical recording medium in accordance with the present invention, in the course of forming the reflection metal layer with a sputtering process in an inert gas atmosphere, the content of residual hydrogen gas in the inert gas atmosphere is kept at a level not higher than 10,000 ppm with respect to the amount of an inert gas, and preferably at a level not higher than 1,000 ppm with respect to the amount of an inert gas. The content of residual hydrogen gas in the inert gas atmosphere should more preferably be kept at a level not higher than 100 ppm with respect to the amount of an inert gas.

In order for the objects of the present invention to be accomplished more efficiently, in the course of forming the reflection metal layer with a sputtering process in an inert gas atmosphere, the content of residual nitrogen gas in the inert gas atmosphere should also be kept at a level not higher than 1,000 ppm with respect to the amount of an inert gas, and preferably at a level not higher than 100 ppm with respect to the amount of an inert gas. The content of residual nitrogen gas in the inert gas atmosphere should more preferably be kept at a level not higher than 10 ppm with respect to the amount of an inert gas.

It is presumed that, in a conventional method for making a magneto-optical recording medium, in the course of forming a reflection metal layer with a sputtering process, hydrogen gas and nitrogen gas remaining in the sputtering chamber will be adsorbed by the surface of the reflection metal layer or confined in the reflection metal layer. When the magneto-optical recording medium having such a reflection metal layer is being used in recording and reproducing information, the hydrogen gas and the nitrogen gas will be liberated by heat from the reflection metal layer and corrode the recording layer. As a result, the EWR characteristics of the magneto-optical recording medium will become poor.

It is also presumed that hydrogen gas and nitrogen gas remaining in the sputtering chamber will adversely affect the quality of the reflection metal layer, which is formed in the sputtering chamber, and the recording layer, which has been formed under the reflection metal layer. As a result, variations in the bias magnetic field characteristics of the magneto-optical recording medium will become large.

It has not yet been clarified why, of various gases remaining in the sputtering chamber, in particular, hydrogen gas and nitrogen gas have large adverse effects on the bias magnetic field characteristics and the EWR characteristics of the magneto-optical recording medium. However, it is presumably because hydrogen gas and nitrogen gas have higher chemical activities with respect to metals or have larger effects on structures of layers than the other gases remaining in the sputtering chamber do.

The aforesaid effects of the first magneto-optical recording medium in accordance with the present invention can be achieved also when the magneto-optical recording film of the magneto-optical recording medium is composed of four layers; i.e. a first protective dielectric layer, a recording layer, a second protective dielectric layer, and a reflection metal layer, which are overlaid in this order on a transparent substrate. In general, in a magneto-optical recording medium having a magneto-optical recording film, which is composed of four layers, such that the Kerr ellipticity may be kept low and a phase difference of the recording sensitivity may be eliminated, the second protective dielectric layer is kept very thin (its thickness falls within the range of 150 Å to 500 Å). Therefore, it is presumed that, if hydrogen gas or nitrogen gas is adsorbed to or confined in the reflection metal layer and thereafter liberated therefrom, the liberated gas will not be sufficiently blocked by the second protective dielectric layer, but will reach and adversely affect the recording layer. However, the first magneto-optical recording medium in accordance with the present invention is free of such a problem.

Hydrogen gas remaining in the sputtering chamber during the sputtering process originates from various sources, e.g. hydrogen which was originally contained as an impurity in the inert gas, hydrogen which is generated when water molecules are decomposed by the catalytic action of a metal, such as a metal of a shield plate located in the sputtering chamber, during the sputtering process, and hydrogen generated from decomposition of an organic compound.

Nitrogen gas remaining in the sputtering chamber during the sputtering process originates from various sources, e.g. nitrogen which was originally contained as an impurity in the inert gas, nitrogen entering from a pipe, through which the inert gas is introduced, and nitrogen contained in the air, which remain in the sputtering chamber after it was evacuated.

In the first magneto-optical recording medium and the first method for making a magneto-optical recording medium in accordance with the present invention, in the course of forming the reflection metal layer, the content of residual hydrogen gas and the content of residual nitrogen gas in the sputtering chamber may be controlled in various manners. For example, the vacuum chamber and the substrate may be degassed sufficiently. In order for the substrate to be degassed, it may be heated at a temperature such that it may not be thermally deformed. The substrate may be heated in the vacuum chamber. The sputtering chamber may also be degassed sufficiently. For this purpose, it is advantageous that the sputtering chamber is heated from the exterior or from the interior. After the sputtering chamber and the substrate have primarily been degassed sufficiently, in the course of forming the reflection metal layer, the content of residual hydrogen gas in the sputtering chamber is adjusted by operating an evacuating apparatus, such as a diffusion pump, a cryo-pump, or a turbine pump, and an orifice control apparatus. Alternatively, both the content of residual hydrogen gas and the content of residual nitrogen gas in the sputtering chamber are adjusted in the same manner. The aforesaid technique for adjusting the contents of residual gases is a mere example, and any of other techniques may be employed.

With the first method for making a magneto-optical recording medium in accordance with the present invention, the content of residual hydrogen gas is kept at a level not higher than the specific level described above in the course of forming the reflection metal layer. Alternatively, both the content of residual hydrogen gas and the content of residual nitrogen gas are kept at levels not higher than the specific levels described above in the course of forming the reflection metal layer. In this manner, a magneto-optical recording medium can be obtained, on which information can be erased and written at an intensity of the bias magnetic field, Hb, of less than 700 Oe, and which exhibits little variation in the necessary intensity of the bias magnetic field, Hb. Also, a magneto-optical recording medium can be obtained, which exhibits excellent EWR characteristics.

The respective layers constituting the magneto-optical recording film of the first magneto-optical recording medium in accordance with the present invention may be formed with a sputtering process. In the course of forming the layers, a low-pressure inert gas is introduced into the sputtering chamber. The inert gas may be, for example, Ar gas, He gas, Kr gas, or Ne gas, among which Ar gas is preferable from the point of view of the cost and the rate, with which a layer is formed.

The reflection metal layer of the first magneto-optical recording medium in accordance with the present invention may be constituted of one of various metals, or an alloy. For example, the reflection metal layer may be constituted of Al, Al—Cu, Al—Ti, Al—Ta, Ni, Ni—Cu, Au, Cu, Cu—Zn, Al—Cr, or Pt, among which Al and an alloy of Al are advantageous for accomplishing the objects of the present invention.

The thickness of the reflection metal layer of the first magneto-optical recording medium in accordance with the present invention falls within the range of 300 Å to 1,000 Å, and preferably within the range of 400 Å to 800 Å.

If the reflection metal layer is thinner than 300 Å, light will readily pass therethrough, and therefore the C/N ratio cannot be kept high. If the reflection metal layer is thicker than 1,000 Å, its heat capacity becomes large, and therefore the sensitivity cannot be kept high.

In cases where the magneto-optical recording film of the first magneto-optical recording medium in accordance with the present invention is composed of three layers, the enhancing layer, the recording layer, and the reflection metal layer are overlaid in this order on the transparent substrate with a sputtering process in a vacuum. In cases where the magneto-optical recording film is composed of four layers, the second protective dielectric layer is formed between the recording layer and the reflection metal layer of the three-layer magneto-optical recording film.

The enhancing layer is constituted of a dielectric and overlaid on the transparent substrate such that it has a thickness falling within the range of 800 Å to 1,300 Å.

The enhancing layer may be constituted of a dielectric selected from the group consisting of oxides, nitrides, and sulfides: for example, $SiO_x$, $SiN_x$, $TaO_x$, $AlN_x$, $SiAlN_x$, and ZnS. From the viewpoint of the optical characteristics and the protective function, nitrides of Si, nitrides of Al, mixtures of these nitrides, and SiAlNx are preferable.

The recording layer is formed on the enhancing layer. The thickness of the recording layer falls within the range of 200 Å to 300 Å.

In order for large effects to be obtained from the first method for making a magneto-optical recording medium in accordance with the present invention, the recording layer should preferably be constituted of an amorphous alloy, which primarily contains at least one transition metal and at least one rare earth metal.

As the transition metal, Fe, Co, Ni, or the like may be employed. As the rare earth metal, Tb, Gd, Dy, Sm, Nd, or the like may be employed. By way of example, the recording layer may be constituted of GdCo, GdFe, TbFe, DyFe, GdFeTb, TbFeCo, DyFeCo, TbFeNi, GdFeCo, or NdDyFeCo, among which TbFeCo is most preferable from the point of view of the tolerance in the manufacturing process. In order that the recording layer may have good resistance to corrosion, it should also contain at least one element selected from the group consisting of Cr, Ti, Ta, Nb, and Pt. Such an element should be contained in proportions falling within the range of 0.5 to 10 at %, and preferably within the range of 3 to 8 at %. A Pt—Co alloy is also preferable as the material for constituting the recording layer.

In cases where the magneto-optical recording film of the first magneto-optical recording medium in accordance with the present invention is composed of four layers, a protective inorganic layer for protecting the recording layer is formed on the recording layer. The thickness of the protective inorganic layer falls within the range of 200 Å to 600 Å.

Ordinarily, like the enhancing layer, the protective inorganic layer is constituted of a dielectric.

The transparent substrate of the first magneto-optical recording medium in accordance with the present invention should preferably have good mechanical characteristics, such as a low surface run-out acceleration and a small amount of surface run-out, such that information can be efficiently recorded and erased when the magneto-optical recording medium is rotated quickly.

The transparent substrate may be constituted of a polycarbonate resin, a polymethyl methacrylate resin, an epoxy resin, glass, or the like. Among these materials, a polycarbonate resin, a polymethyl methacrylate resin, and an epoxy resin are preferable from the point of view of the cost. In particular, a polycarbonate resin is advantageous in that it absorbs little moisture and has a high glass transition point.

After the magneto-optical recording film is formed by overlaying the layers on the substrate, the upper surface and the side surface of the magneto-optical recording film may be covered with a protective layer constituted of an organic resin, such as an ultraviolet-curing resin. Also, the surface of the substrate on the side opposite to the recording layer may be covered with a layer constituted of an ultraviolet-curing resin, or the like. In this manner, the stability of the first magneto-optical recording medium in accordance with the present invention during its storage may be improved.

Also, the first magneto-optical recording medium in accordance with the present invention may take on the form of a double-faced type of magneto-optical recording medium. Specifically, two magneto-optical recording media in accordance with the present invention may be laminated via an adhesive layer such that their substrates face outward and their magneto-optical recording films face each other via the adhesive layer. The adhesive layer may be constituted of a hot-melt adhesive or an epoxy resin adhesive. Such a double-faced type of magneto-optical recording medium exhibits good mechanical characteristics.

The second magneto-optical recording medium and the second method for making a magneto-optical recording medium in accordance with the present invention will be described hereinbelow.

Among various gases other than the inert gas, which remain in the inert gas atmosphere in the course of forming a recording layer with a sputtering process, in particular, the content of residual hydrogen gas should be kept at a level not higher than a specific level with respect to the amount of the inert gas. Keeping the content of residual hydrogen gas at a level not higher than the specific level with respect to the amount of the inert gas in the course of forming the recording layer is important in order for the second magneto-optical recording medium in accordance with the present invention, which exhibits excellent and stable bias magnetic field characteristics and excellent and stable EWR characteristics, to De obtained. In order for larger effects of the second magneto-optical recording medium in accordance with the present invention to be obtained, the content of residual nitrogen gas should also be kept at a level not higher than the specific level with respect to the amount of the inert gas in the course of forming the recording layer. Also, particularly large effects of the second magneto-optical recording medium in accordance with the present invention can be obtained when the magneto-optical recording film of the magneto-optical recording medium is composed of four layers; i.e. a first protective dielectric layer (an enhancing layer), a recording layer, a second protective dielectric layer, and a reflection metal layer, which are overlaid in this order on a transparent substrate.

Therefore, in the second magneto-optical recording medium and the second method for making a magneto-optical recording medium in accordance with the present invention, in the course of forming the recording layer with a sputtering process in an inert gas atmosphere, the content of residual hydrogen gas in the inert gas atmosphere is kept at a level not higher than 1,000 ppm with respect to the amount of an inert gas, and preferably at a level not higher than 100 ppm with respect to the amount of an inert gas. The content of residual hydrogen gas in the inert gas atmosphere should more preferably be kept at a level not higher than 10 ppm with respect to the amount of an inert gas.

In order for the objects of the present invention to be accomplished more efficiently, in the course of forming the recording layer with a sputtering process in an inert gas atmosphere, the content of residual nitrogen gas in the inert gas atmosphere should also be kept at a level not higher than 1,000 ppm with respect to the amount of an inert gas, and preferably at a level not higher than 100 ppm with respect to the amount of an inert gas. The content of residual nitrogen gas in the inert gas atmosphere should more preferably be kept at a level not higher than 10 ppm with respect to the amount of an inert gas.

It is presumed that, in a conventional method for making a magneto-optical recording medium, in the course of forming a recording layer on a transparent substrate with a sputtering process by applying a predetermined level of electric power to a magnetic material target, hydrogen gas and nitrogen gas remaining in the sputtering chamber will be adsorbed by the surface of the recording layer or confined in the recording layer. When the magneto-optical recording medium having such a recording layer is being used in recording and reproducing information, the hydrogen gas and the nitrogen gas will be liberated by heat from the recording layer and corrode the recording layer. As a result, the EWR characteristics of the magneto-optical recording medium will become poor.

In the second magneto-optical recording medium and the second method for making a magneto-optical recording medium in accordance with the present invention, in the course of forming the recording layer, the content of residual hydrogen gas and the content of residual nitrogen gas in the sputtering chamber may be controlled in various manners as in cases where the reflection metal layer is formed with the first method for making a magneto-optical recording medium in accordance with the present invention. For example, after the sputtering chamber and the substrate have primarily been degassed sufficiently in the same manner as that described above, in the course of forming the recording layer, the content of residual hydrogen gas in the sputtering chamber is adjusted by operating an evacuating apparatus, such as a diffusion pump, a cryo-pump, or a turbine pump, and an orifice control apparatus. Alternatively, both the content of residual hydrogen gas and the content of residual nitrogen gas in the sputtering chamber are adjusted in the same manner. The aforesaid technique for adjusting the contents of residual gases is a mere example, and any of other techniques may be employed.

With the second method for making a magneto-optical recording medium in accordance with the present invention, the content of residual hydrogen gas is kept at a level not higher than the specific level described above in the course of forming the recording layer. Alternatively, both the content of residual hydrogen gas and the content of residual nitrogen gas are kept at levels not higher than the specific levels described above in the course of forming the recording layer. In this manner, a magneto-optical recording medium can be obtained, on which information can be erased and written at an intensity of the bias magnetic field, Hb, of less than 700 Oe, and which exhibits little variation in the necessary intensity of the bias magnetic field, Hb.

Specifically, as for a magneto-optical recording medium obtained with a conventional method, wherein the content of residual hydrogen gas and the content of residual nitrogen gas are not limited to specific levels, the intensity of the bias magnetic field, Hb, which is necessary during the erasing and the writing of information, varies over the wide range of 100 to 700 Oe for different samples of the conventional magneto-optical recording medium. On the other hand, with the second method for making a magneto-optical recording medium in accordance with the present invention, by keeping the content of residual hydrogen gas at a level not higher than the specific level, or by keeping both the content of residual hydrogen gas and the content of residual nitrogen gas at levels not higher than the specific levels, a magneto-optical recording medium can be obtained which exhibits characteristics such that the intensity of the bias magnetic field, Hb, which is necessary during the erasing and the writing of information, varies over the narrow range of 200 to 300 Oe for different samples of the magneto-optical recording medium.

Also, with the second method for making a magneto-optical recording medium in accordance with the present invention, a magneto-optical recording medium can be obtained, which exhibits excellent EWR characteristics.

The respective layers constituting the magneto-optical recording film of the second magneto-optical recording medium in accordance with the present invention may be formed with a sputtering process. In the course of forming the layers, a low-pressure inert gas is introduced into the sputtering chamber. The inert gas may be, for example, Ar gas, He gas, Kr gas, or Ne gas, among which Ar gas is preferable from the point of view of the cost and the rate, with which a layer is formed.

In the second magneto-optical recording medium and the second method for making a magneto-optical recording medium in accordance with the present invention, the recording layer may be constituted of one of various alloys described above, which contains at least one transition metal and at least one rare earth metal. Among the above-enumerated alloys, TbFeCo is most preferable from the point of view of the tolerance in the manufacturing process. In order that the recording layer may have good resistance to corrosion, it should also contain at least one element selected from the group consisting of Cr, Ti, Ta, Nb, and Pt. Such an element should be contained in proportions falling within the range of 0.5 to 10 at %, and preferably within the range of 3 to 8 at %. A Pt—Co alloy is also preferable as the material for constituting the recording layer.

In cases where the magneto-optical recording film of the second magneto-optical recording medium in accordance with the present invention is composed of four layers, the thickness of the recording layer should preferably fall within the range of 200 Å to 300 Å. In cases where the magneto-optical recording film is composed of three layers, the thickness of the recording layer should preferably fall within the range of 500 Å to 2,000 Å.

In cases where the magneto-optical recording film of the second magneto-optical recording medium in accordance with the present invention is composed of four layers, if the recording layer is very thin, a high C/N ratio cannot be obtained because of the sensitivity and the reflectivity. In cases where the magneto-optical recording film is composed of three layers, the recording layer should not be very thin from the point of view of the sensitivity and the C/N ratio. If the recording layer is too thick, its sensitivity will become low.

In the second magneto-optical recording medium in accordance with the present invention, a first protective dielectric layer is formed between the transparent substrate and the recording layer of the magneto-optical recording film.

Also, in order for the recording and reproducing characteristics to be kept good, a reflection metal layer may be formed as a top layer of the magneto-optical recording film.

In cases where the magneto-optical recording film of the second magneto-optical recording medium in accordance with the present invention is composed of three layers, the first protective dielectric layer (the enhancing layer), the recording layer, and the reflection metal layer or a dielectric layer are overlaid in this order on the transparent substrate with a sputtering process. In cases where the magneto-optical recording film is composed of four layers, the second protective dielectric layer is formed between the recording layer and the reflection metal layer of the three-layer magneto-optical recording film.

The first protective dielectric layer is overlaid on the transparent substrate such that it has a thickness falling within the range of 800 Å to 1,300 Å.

The first protective dielectric layer may be constituted of a dielectric selected from the group consisting of oxides, nitrides, and sulfides: for example, $SiO_x$, $SiN_x$, $TaO_x$, $AlN_x$, $SiAlN_x$, and ZnS. From the viewpoint of the optical characteristics and the protective function, nitrides of Si, nitrides of Al, mixtures of these nitrides, and $SiAlN_x$ are preferable.

The thickness of the second protective dielectric layer should preferably fall within the range of 200 Å to 500 Å.

The reflection metal layer of the second magneto-optical recording medium in accordance with the present invention may be constituted of one of various metals or an alloy described above.

The thickness of the reflection metal layer of the second magneto-optical recording medium in accordance with the present invention falls within the range of 300 Å to 1,000 Å, and preferably within the range of 400 Å to 800 Å.

In order for large effects to be obtained from the second method for making a magneto-optical recording medium in accordance with the present invention, the content of residual hydrogen gas and the content of residual nitrogen gas in the sputtering chamber should also be kept at levels not higher than specific levels in the course of forming the reflection metal layer.

The transparent substrate of the second magneto-optical recording medium in accordance with the present invention should preferably have good mechanical characteristics, such as a low surface run-out acceleration and a small amount of surface run-out, such that information can be efficiently recorded and erased when the magneto-optical recording medium is rotated quickly.

The transparent substrate may be constituted of one of the materials described above.

After the magneto-optical recording film of the second magneto-optical recording medium in accordance with the present invention is formed by overlaying the layers on the substrate, the upper surface and the side surface of the magneto-optical recording film may be covered with a protective layer constituted of an organic resin, such as an ultraviolet-curing resin. Also, the surface of the substrate on the side opposite to the recording layer may be covered with a layer constituted of an ultraviolet-curing resin, or the like. In this manner, the stability of the second magneto-optical recording medium in accordance with the present invention during its storage may be improved.

Also, the second magneto-optical recording medium in accordance with the present invention may take on the form of a double-faced type of magneto-optical recording medium. Specifically, two magneto-optical recording media in accordance with the present invention may be laminated via an adhesive layer such that their substrates face outward and their magneto-optical recording films face each other via the adhesive layer. The adhesive layer may be constituted of a hot-melt adhesive or an epoxy resin adhesive. Such a double-faced type of magneto-optical recording medium exhibits good mechanical characteristics.

The third magneto-optical recording medium and the third method for making a magneto-optical recording medium in accordance with the present invention will be described hereinbelow.

Among various gases other than the inert gas, which remain in the inert gas atmosphere in the course of forming a protective dielectric layer with a sputtering process, in particular, the content of residual hydrogen gas should be kept at a level not higher than a specific level with respect to the amount of the inert gas. Keeping the content of residual hydrogen gas at a level not higher than the specific level with respect to the amount of the inert gas in the course of forming the protective dielectric layer is important in order for the third magneto-optical recording medium in accordance with the present invention, which exhibits excellent and stable bias magnetic field characteristics and excellent and stable EWR characteristics, to be obtained. The protective dielectric layer serves as an interference layer for a recording layer. Therefore, the effects of the third magneto-optical recording medium in accordance with the present invention depend largely upon the state of the interface between the recording layer and the protective dielectric layer.

Also, particularly large effects of the third magneto-optical recording medium in accordance with the present invention can be obtained when the magneto-optical recording film of the magneto-optical recording medium is composed of four layers; i.e. a first protective dielectric layer (an enhancing layer), a recording layer, a second protective dielectric layer, and a reflection metal layer, which are overlaid in this order on a transparent substrate.

Therefore, in the third magneto-optical recording medium and the third method for making a magneto-optical recording medium in accordance with the present invention, in the course of forming the protective dielectric layer on the transparent substrate or on the recording layer, which has been overlaid on the transparent substrate, with a sputtering process in an inert gas atmosphere, the content of residual hydrogen gas in the inert gas atmosphere is kept at a level not higher than 1,000 ppm with respect to the amount of an inert gas. In order for the objects of the present invention to be accomplished more efficiently, the content of residual hydrogen gas in the inert gas atmosphere should preferably be kept at a level not higher than 100 ppm with respect to the amount of an inert gas, and more preferably at a level not higher than 10 ppm with respect to the amount of an inert gas.

It is presumed that, in a conventional method for making a magneto-optical recording medium, hydrogen gas remaining in the sputtering chamber will be adsorbed by the surface of the protective dielectric layer or confined in the protective dielectric layer. When the magneto-optical recording medium having such a protective dielectric layer is being used in recording and reproducing information, the hydrogen gas and the nitrogen gas will be liberated by heat from the protective dielectric layer and corrode the adjacent recording layer. As a result, the EWR characteristics of the magneto-optical recording medium will become poor.

In the third magneto-optical recording medium and the third method for making a magneto-optical recording medium in accordance with the present invention, in the course of forming the protective dielectric layer, the content of residual hydrogen gas in the sputtering chamber may be controlled in various manners as in cases where the reflection metal layer is formed with the first method for making a magneto-optical recording medium in accordance with the present invention. For example, after the sputtering chamber and the substrate have primarily been degassed sufficiently in the same manner as that described above, in the course of forming the protective dielectric layer, the content of residual hydrogen gas in the sputtering chamber is adjusted by operating an evacuating apparatus, such as a diffusion pump, a cryo-pump, or a turbine pump, and an orifice control apparatus. The aforesaid technique for adjusting the content of residual hydrogen gas is a mere example, and any of other techniques may be employed.

With the third method for making a magneto-optical recording medium in accordance with the present invention, the content of residual hydrogen gas is kept at a level not higher than the specific level described above in the course of forming the protective dielectric layer. In this manner, a magneto-optical recording medium can be obtained, on which information can be erased and written at an intensity of the bias magnetic field, Hb, of less than 700 Oe, and which exhibits little variation in the necessary intensity of the bias magnetic field, Hb.

Specifically, as for a magneto-optical recording medium obtained with a conventional method, wherein the content of residual hydrogen gas is not limited to a specific level, the intensity of the bias magnetic field, Hb, which is necessary during the erasing and the writing of information, is comparatively high and varies over the wide range of 100 to 700 Oe for different samples of the conventional magneto-optical recording medium. On the other hand, with the third method for making a magneto-optical recording medium in accordance with the present invention, by keeping the content of residual hydrogen gas at a level not higher than the specific level, a magneto-optical recording medium can be obtained which exhibits characteristics such that the intensity of the bias magnetic field, Hb, which is necessary during the erasing and the writing of information, is not higher than 300 Oe and varies over the narrow range of 200 to 300 Oe for different samples of the magneto-optical recording medium.

Also, with the third method for making a magneto-optical recording medium in accordance with the present invention, a magneto-optical recording medium can be obtained, which exhibits excellent EWR characteristics.

In the course of forming the respective layers constituting the magneto-optical recording film of the third magneto-optical recording medium in accordance with the present invention, a low-pressure inert gas is introduced into the sputtering chamber. The inert gas may be, for example, Ar gas, Be gas, Kr gas, or Ne gas, among which Ar gas is preferable from the point of view of the cost and the rate, with which a layer is formed.

In the course of making the third magneto-optical recording medium in accordance with the present invention, the first protective dielectric layer is formed on the transparent substrate. The recording layer is then formed on the first protective dielectric layer. Thereafter, the second protective dielectric layer or the reflection metal layer is overlaid on the recording layer. In cases where the second protective dielectric layer is overlaid on the recording layer, the characteristics of the third magneto-optical recording medium may be improved even further by forming a reflection metal layer on the second protective dielectric layer.

As described above, the magneto-optical recording film of the third magneto-optical recording medium in accordance with the present invention is composed of three layers or four layers. In both cases, in the course of forming at least either one of the first protective dielectric layer and the second protective dielectric layer, the content of residual hydrogen gas in the low-pressure inert gas atmosphere in the sputtering chamber is kept at a level not higher than the specific level. In this manner, a magneto-optical recording medium can be obtained, which exhibits excellent bias magnetic field characteristics and excellent EWR characteristics.

The first protective dielectric layer of the magneto-optical recording film of the third magneto-optical recording medium in accordance with the present invention is overlaid on the transparent substrate such that it has a thickness falling within the range of 800 Å to 1,300 Å.

The first protective dielectric layer may be constituted of a dielectric selected from the group consisting of oxides, nitrides, and sulfides: for example, $SiO_x$, $SiN_x$, $TaO_x$, $AlN_x$, $SiAlN_x$, and ZnS. From the viewpoint of the optical characteristics and the protective function, nitrides of Si, nitrides of Al, mixtures of these nitrides, and $SiAlN_x$ are preferable.

The thickness of the first protective dielectric layer falls within the range of 500 Å to 1,500 Å, and preferably within the range of 700 Å to 1,200 Å.

If the first protective dielectric layer is very thin or very thick, the reflectivity becomes high, and a high C/N ratio cannot be obtained.

Basically, the second protective dielectric layer is constituted of the same material as that of the first protective dielectric layer. In cases where the magneto-optical recording film is composed of three layers, the thickness of the second protective dielectric layer should fall within the range of 500 Å to 1,500 Å, and preferably within the range of 600 Å to 1,200 Å. In cases where the magneto-optical recording film is composed of four layers, the thickness of the second protective dielectric layer should fall within the range of 200 Å to 500 Å, and preferably within the range of 250 Å to 400 Å.

If the thickness of the second protective dielectric layer is very large, the sensitivity will become low in cases where the magneto-optical recording film is composed of three layers, and a high C/N ratio cannot be obtained in cases where the magneto-optical recording film is composed of four layers.

If the thickness of the second protective dielectric layer is very small, a large protective effect cannot be obtained in cases where the magneto-optical recording film is composed of three layers, and a high C/N ratio cannot be obtained in cases where the magneto-optical recording film is composed of four layers.

The recording layer of the third magneto-optical recording medium in accordance with the present invention may be constituted of an alloy of at least one transition metal and at least one rare earth metal as described above.

In cases where the magneto-optical recording film of the third magneto-optical recording medium in accordance with the present invention is composed of four layers, the thickness of the recording layer should preferably fall within the range of 200 Å to 300 Å. In cases where the magneto-optical recording film is composed of three layers, the thickness of the recording layer should preferably fall within the range of 500 Å to 1,500 Å.

The reflection metal layer of the third magneto-optical recording medium in accordance with the present invention may be constituted of one of various metals or an alloy described above.

The thickness of the reflection metal layer of the third magneto-optical recording medium in accordance with the present invention falls within the range of 300 Å to 1,000 Å, and preferably within the range of 400 Å to 800 Å.

In order for large effects to be obtained from the third method for making a magneto-optical recording medium in accordance with the present invention, the content of residual hydrogen gas and the content of residual nitrogen gas in the sputtering chamber should also be kept at levels not higher than specific levels in the course of forming the reflection metal layer.

The transparent substrate of the third magneto-optical recording medium in accordance with the present invention should preferably have good mechanical characteristics, such as a low surface run-out acceleration and a small amount of surface run-out, such that information can be efficiently recorded and erased when the magneto-optical recording medium is rotated quickly.

The transparent substrate may be constituted of one of the materials described above.

After the magneto-optical recording film of the third magneto-optical recording medium in accordance with the present invention is formed by overlaying the layers on the substrate, the upper surface and the side surface of the magneto-optical recording film may be covered with a protective layer constituted of an organic resin, such as an ultraviolet-curing resin. Also, the surface of the substrate on the side opposite to the recording layer may be covered with a layer constituted of an ultraviolet-curing resin, or the like. In this manner, the stability of the third magneto-optical recording medium in accordance with the present invention during its storage may be improved.

Also, the third magneto-optical recording medium in accordance with the present invention may take on the form of a double-faced type of magneto-optical recording medium. Specifically, two magneto-optical recording media in accordance with the present invention may be laminated via an adhesive layer such that their substrates face outward and their magneto-optical recording films face each other via the adhesive layer. The adhesive layer may be constituted of a hot-melt adhesive or an epoxy resin adhesive. Such a double-faced type of magneto-optical recording medium exhibits good mechanical characteristics.

The present invention will further be illustrated by the following nonlimitative examples.

EXAMPLE 1

A plurality of 130 mm-diameter, 1.2 mm-thick polycarbonate substrates were prepared. Each of the substrate had guide grooves at a pitch of 1.6 µm on the surface. Each of the substrate was set on a rotatable substrate holder of a sputtering apparatus. Argon gas was then introduced into a sputtering chamber of the sputtering apparatus until the gas pressure reached 1 to 5 mTorr.

A magnetron sputtering process was then carried out. First, an $SiN_x$ layer serving as an enhancing layer was overlaid to a thickness of 1,100 Å on the substrate.

Thereafter, a dual simultaneous sputtering process was carried out by applying electric power to an FeCoCr alloy target and a Tb target. In this manner, a recording layer having a composition expressed as $Tb_{18}Fe_{66}Co_8 Cr_6$ was formed to a thickness of 250 521 on the enhancing layer.

An $SiN_x$ layer serving as a second protective dielectric layer was then overlaid to a thickness of 250 Å on the recording layer.

Thereafter, an Al—Ta alloy layer serving as a reflection metal layer was overlaid to a thickness of 500 Å on the second protective dielectric layer.

In the course of forming the reflection metal layers for the plurality of the substrates, the content of residual hydrogen gas and the content of residual nitrogen gas in the sputtering chamber were controlled by changing the degassing period and the evacuating power of a cryo-pump and by measuring the contents with a residual gas measuring device, which was connected to the sputtering chamber. The reflection metal layers were thus formed under five different conditions shown at A through E in Table 1 for different substrates. In this manner, under each of the five different conditions, 100 samples of a magneto-optical recording medium were made. The magneto-optical recording medium comprised the substrate and a magneto-optical recording film, which was overlaid on the substrate and composed of four layers; i.e. the enhancing layer, the recording layer, the second protective dielectric layer, and the reflection metal layer.

The scopes of control of the content of residual hydrogen gas and the content of residual nitrogen gas in the course of forming the reflection metal layer were changed as shown in Table 1. In Table 1, the proportions of the partial pressures of residual hydrogen gas and residual nitrogen gas with respect to the partial pressure of argon gas are expressed in units of ppm.

The content of each residual gas was determined by connecting a differential evacuating apparatus to a quadruple-pole mass spectrometer. Specifically, the analysis tube was differentially evacuated, and then ions were generated in the analysis tube. The ions were separated from one another in accordance with their masses with the quadruple-pole electrode, and were detected through a secondary electron multiplier. At this time, the pressure reduction ratio of differential evacuation was set such that a pressure of $1\times10^{-3}$ Torr might be obtained. Also, the pressure of argon gas used during the sputtering process was monitored with a Baratron vacuum gauge, and the emission voltage was determined such that it might be equal to $1\times10^{31\ 3}$ Torr, as a value displayed on a display device. In the course of obtaining a measured value, the detected value was corrected with a correction coefficient inherent to the element to be detected. The analysis chamber was evacuated sufficiently such that the partial pressure of each residual gas might be below $5\times10^{-11}$ Torr. Also, the structure of the analysis apparatus was devised such that the content of a gas as low as approximately $1\times10^{-9}$ Torr could be detected.

As for the samples of the magneto-optical recording medium, which were made in the manner described above, the bias magnetic field characteristics and the EWR characteristics were rated in the manner described below.

Rating of the bias magnetic field characteristics

Information was recorded and reproduced with a drive apparatus, which had a pickup, wherein NA was 0.50, and a semiconductor producing a laser beam having a wavelength of 830 nm. The rotation speed was set to 2,400 rpm, and the pickup was caused to follow up under servo control. In the course of recording information, the previously recorded information was erased at an 8 mW laser power and an intensity of the bias magnetic field of 0 to 700 Oe, and then information was recorded at a 0.75 μm pit at a 5.5 mW laser power, at an intensity of the bias magnetic field of 0 to 700 Oe, and at a recording frequency of 4.93 MHz. During the erasing and the writing, the intensity of the bias magnetic field was kept the same. Thereafter, the information was read at a 1.5 mW laser power, and the C/N ratio was determined with a spectrum analyzer. Determination of the C/N ratio was carried out for various different intensities of bias magnetic fields. An intensity of the bias magnetic field associated with saturation of the C/N ratio was found. Thereafter, the intensity of the bias magnetic field, which corresponded to a C/N ratio lower by 1dB than the saturated C/N ratio, was determined as the value of the intensity of the bias magnetic field.

Rating of the EWR characteristics

By using the drive apparatus described above, information was erased at an 8 mW laser power and an intensity of the bias magnetic field of 300 Oe. Thereafter, information was written at a 5.5 mW laser power and an intensity of the bias magnetic field of 300 Oe. The C/N ratio was found at a 1.5 mW laser power with a spectrum analyzer. The erasing-writing-reproducing cycle was repeated 100,000 times at the same track position. A calculation was made to find the difference in the C/N ratio before the 100,000 cycles were carried out and after the 100,000 cycles were carried out. The amount of deterioration in the C/N ratio was rated from the difference thus calculated.

The results of the measurement are shown in Table 1.

TABLE 1

| Sample | Contents of residual gases during the formation of the reflection metal layer (ppm) | | Variations in bias magnetic field characteristics (Oe) | EWR characteristics (the C/N ratio after 100,000 cycles - the initial C/N ratio) (dB) |
|---|---|---|---|---|
| | Hydrogen | Nitrogen | | |
| A | 500–10000 | 500–1000 | 200–300 | −2.0—4.0 |
| B | 1000–5000 | 100–500 | 200–300 | −1.0—2.0 |
| C | 500–1000 | 50–100 | 200–250 | −0.5—1.0 |
| D | 100–500 | 10–50 | 200–250 | Less than −0.5 |
| E | Lower than 100 | Lower than 10 | 200–250 | 0.0 |

Comparative Example 1

One hundred samples of a magneto-optical recording medium were made under each of different conditions in the same manner as that in Example 1, except that, in the course of forming the reflection metal layers for the plurality of the substrates, the content of residual hydrogen gas and the content of residual nitrogen gas in the sputtering chamber were set to six different levels shown at F through K in Table 2 by changing the degassing period and the evacuating power of the cryo-pump.

As for the samples of the magneto-optical recording medium, which were made in the manner described above, the bias magnetic field characteristics and the EWR characteristics were rated in the same manner as that in Example 1.

The results of the rating are shown in Table 2.

TABLE 2

| Sample | Contents of residual gases during the formation of the reflection metal layer (ppm) | | Variations in bias magnetic field characteristics (Oe) | EWR characteristics (the C/N ratio after 100,000 cycles - the initial C/N ratio) (dB) |
|---|---|---|---|---|
| | Hydrogen | Nitrogen | | |
| F | Higher than 50000 | Higher than 10000 | 100–higher than 700 | More than −10 |
| G | 20000–40000 | 5000–10000 | 100–700 | More than −10 |
| H | 20000–40000 | 2000–5000 | 100–700 | −7.0 |
| I | 10000–20000 | 1000–2000 | 100–500 | −7.0 |
| J | 10000–20000 | 500–1000 | 100–700 | −5.0 |
| K | 5000–10000 | 1000–2000 | 100–500 | −5.0 |

EXAMPLE 2

A plurality of 130 mm-diameter, 1.2 mm-thick polycarbonate substrates were prepared. Each of the substrate had guide grooves at a pitch of 1.6 μm on the surface. Each of the substrate was set on a rotatable substrate holder of a sputtering apparatus. Argon gas was then introduced into a sputtering chamber of the sputtering apparatus until the gas pressure reached 1 to 5 mTorr.

A magnetron sputtering process was then carried out. First, an $SiN_x$ layer serving as a first protective dielectric layer was overlaid to a thickness of 1,100 Å on the substrate.

Thereafter, a dual simultaneous sputtering process was carried out by applying electric power to an FeCoCr alloy target and a Tb target. In this manner, a recording layer having a composition expressed as $Tb_{18}Fe_{68}Co_8Cr_6$ was formed to a thickness of 250 Å on the first protective dielectric layer.

In the course of forming the recording layers for the plurality of the substrates, the content of residual hydrogen gas and the content of residual nitrogen gas in the sputtering chamber were controlled by changing the degassing period and the evacuating power of a cryo-pump and by measuring the contents with a residual gas measuring device, which was connected to the sputtering chamber. The recording layers were thus formed under five different conditions shown at A through E in Table 3 for different substrates.

An $SiN_x$ layer serving as a second protective dielectric layer was then overlaid to a thickness of 450 Å on the recording layer.

Thereafter, an Al—Ta alloy layer serving as a reflection metal layer was overlaid to a thickness of 500 Å on the second protective dielectric layer.

In this manner, under each of the five different conditions, 100 samples of a magneto-optical recording medium were made. The magneto-optical recording medium comprised the substrate and a magneto-optical recording film, which was overlaid on the substrate and composed of four layers; i.e. the first protective dielectric layer, the recording layer, the second protective dielectric layer, and the reflection metal layer.

The scopes of control of the content of residual hydrogen gas and the content of residual nitrogen gas in the course of forming the recording layer were changed as shown in Table 3. In Table 3, the proportions of the partial pressures of residual hydrogen gas and residual nitrogen gas with respect to the partial pressure of argon gas are expressed in units of ppm.

The content of each residual gas was determined in the same manner as that in Example 1.

As for the samples of the magneto-optical recording medium, which were made in the manner described above, the bias magnetic field characteristics and the EWR characteristics were rated in the same manner as that in Example 1.

The results of the measurement are shown in Table 3.

TABLE 3

| Sample | Contents of residual gases during the formation of the reflection layer (ppm) | | Variations in bias magnetic field characteristics (Oe) | EWR characteristics (the C/N ratio after 100,000 cycles - the initial C/N ratio) (dB) |
|---|---|---|---|---|
| | Hydrogen | Nitrogen | | |
| A | 500–1000 | 500–1000 | 200–300 | −2.0—−4.0 |
| B | 100–500 | 100–500 | 100–300 | −1.0—−2.0 |
| C | 50–100 | 50–100 | 150–250 | −0.5—−1.0 |
| D | 10–50 | 10–50 | 150–200 | Less than −0.5 |
| E | Lower than 10 | Lower than 10 | 150–200 | 0.0 |

Comparative Example 2

One hundred samples of a magneto-optical recording medium were made under each of different conditions in the same manner as that in Example 2, except that, in the course of forming the recording layers for the plurality of the substrates, the content of residual hydrogen gas and the content of residual nitrogen gas in the sputtering chamber were set to six different levels shown at F through K in Table 4 by changing the degassing period and the evacuating power of the cryo-pump.

As for the samples of the magneto-optical recording medium, which were made in the manner described above, the bias magnetic field characteristics and the EWR characteristics were rated in the same manner as that in Example 2.

The results of the rating are shown in Table 4.

TABLE 4

| Sample | Contents of residual gases during the formation of the reflection layer (ppm) | | Variations in bias magnetic field characteristics (Oe) | EWR characteristics (the C/N ratio after 100,000 cycles - the initial C/N ratio) (dB) |
|---|---|---|---|---|
| | Hydrogen | Nitrogen | | |
| F | Higher than 10000 | Higher than 10000 | Higher than 700 | More than −10 |
| G | 5000–10000 | 5000–10000 | Higher than 700 | More than −10 |
| H | 2000–5000 | 2000–5000 | 500–700 | −7.0 |
| I | 1000–2000 | 1000–2000 | 500–700 | −7.0 |
| J | 1000–2000 | 500–2000 | 200–500 | −5.0 |
| K | 500–1000 | 1000–2000 | 300–600 | −5.0 |

EXAMPLE 3

A plurality of 130 mm-diameter, 1.2 mm-thick polycarbonate substrates were prepared. Each of the substrate had guide grooves at a pitch of 1.6 μm on the surface. Each of the substrate was set on a rotatable substrate holder of a sputtering apparatus. Argon gas was then introduced into a sputtering chamber of the sputtering apparatus until the gas pressure reached 1 to 5 mTorr.

A magnetron sputtering process was then carried out. First, an $SiN_x$ layer serving as a first protective dielectric layer was overlaid to a thickness of 1,100 Å on the substrate.

In the course of forming the first protective dielectric layers for the plurality of the substrates, the content of residual hydrogen gas in the sputtering chamber was controlled by changing the degassing period and the evacuating power of a cryo-pump and by measuring the contents with a residual gas measuring device, which was connected to the sputtering chamber. The first protective dielectric layers were thus formed under five different conditions shown at A through E in Table 5 for different substrates.

After the first protective dielectric layer was formed on each substrate, a recording layer, a second protective dielectric layer, and a reflection metal layer were overlaid in this order on the first protective dielectric layer in the manner described below. During the formation of the recording layer, a second protective dielectric layer, and a reflection metal layer, the gas pressure of the low-pressure inert gas atmosphere in the sputtering chamber was controlled such that it fallen within the range of 1 to 5 mmTorr.

Specifically, a dual simultaneous sputtering process was carried out by applying electric power to an FeCoCr alloy target and a Tb target. In this manner, a recording layer having a composition expressed as $Tb_{18}Fe_{68}Co_8Cr_6$ was formed to a thickness of 250 Å on the first protective dielectric layer.

An $SiN_x$ layer serving as a second protective dielectric layer was then overlaid to a thickness of 450 Å on the recording layer.

Thereafter, an Al—Ta alloy layer serving as a reflection metal layer was overlaid to a thickness of 500 Å on the second protective dielectric layer.

In this manner, under each of the five different conditions, 100 samples of a magneto-optical recording medium were made. The magneto-optical recording medium comprised the substrate and a magneto-optical recording film, which was overlaid on the substrate and composed of four layers; i.e. the first protective dielectric layer, the recording layer, the second protective dielectric layer, and the reflection metal layer.

The scope of control of the content of residual hydrogen gas in the course of forming the first protective dielectric layer was changed as shown in Table 5. In Table 5, the proportion of the partial pressure of residual hydrogen gas with respect to the partial pressure of argon gas is expressed in units of ppm.

The content of each residual gas was determined in the same manner as that in Example 1.

As for the samples of the magneto-optical recording medium, which were made in the manner described above, the bias magnetic field characteristics and the EWR characteristics were rated in the same manner as that in Example 1.

The results of the measurement are shown in Table 5.

TABLE 5

| Sample | Content of residual hydrogen gas during the formation of the first protective dielectric layer (ppm) | Variations in bias magnetic field characteristics (Oe) | EWR characteristics (the C/H ratio after 100,000 cycles - the initial C/N ratio) (dB) |
| --- | --- | --- | --- |
| A | 500–1000 | 200–300 | −2.0—4.0 |
| B | 100–500 | 100–300 | −1.0—2.0 |
| C | 50–100 | 200–250 | −0.5—1.0 |
| D | 10–50 | 200–250 | Less than −0.5 |
| E | Lower than 10 | 200–250 | 0.0 |

Comparative Example 3

One hundred samples of a magneto-optical recording medium were made under each of different conditions in the same manner as that in Example 3, except that, in the course of forming the first protective dielectric layers for the plurality of the substrates, the content of residual hydrogen gas in the sputtering chamber was set to four different levels shown at F through I in Table 6 by changing the degassing period and the evacuating power of the cryo-pump.

As for the samples of the magneto-optical recording medium, which were made in the manner described above, the bias magnetic field characteristics and the EWR characteristics were rated in the same manner as that in Example 3.

The results of the rating are shown in Table 6.

TABLE 6

| Sample | Content of residual hydrogen gas during the formation of the first protective dielectric layer (ppm) | Variations in bias magnetic field characteristics (Oe) | EWR characteristics (the C/H ratio after 100,000 cycles - the initial C/N ratio) (dB) |
| --- | --- | --- | --- |
| F | Higher than 10000 | 100–higher than 700 | More than −10 |
| G | 5000–10000 | 100–700 | −5—10 |
| H | 2000–5000 | 100–700 | −5.0 |
| I | 1000–2000 | 100–500 | −5.0 |

EXAMPLE 4

One hundred samples of a magneto-optical recording medium were made under each of different conditions in the same manner as that in Example 3, except that, only in the course of forming the second protective dielectric layers for the plurality of the substrates, the content of residual hydrogen gas with respect to the low-pressure inert gas in the sputtering chamber was set to five different levels shown at J through N in Table 7. In the course of forming the layers other than the second protective dielectric layer, the content of residual hydrogen gas in the sputtering chamber was not controlled.

As for the samples of the magneto-optical recording medium, which were made in the manner described above, the bias magnetic field characteristics and the EWR characteristics were rated in the same manner as that in Example 3.

The results of the rating are shown in Table 7.

TABLE 7

| Sample | Content of residual hydrogen gas during the formation of the first protective dielectric layer (ppm) | Variations in bias magnetic field characteristics (Oe) | EWR characteristics (the C/H ratio after 100,000 cycles - the initial C/N ratio) (dB) |
| --- | --- | --- | --- |
| J | 500–1000 | 200–300 | −2.0—4.0 |
| K | 100–500 | 100–300 | −1.0—2.0 |
| L | 50–100 | 200–250 | −0.5—1.0 |
| M | 10–50 | 200–250 | Less than −0.5 |
| N | Lower than 10 | 200–250 | 0.0 |

Comparative Example 4

One hundred samples of a magneto-optical recording medium were made under each of different conditions in the same manner as that in Example 4, except that, in the course of forming the second protective dielectric layers for the plurality of the substrates, the content of residual hydrogen gas in the sputtering chamber was set to four different levels shown at P through S in Table 8 by changing the degassing period and the evacuating power of the cryo-pump.

As for the samples of the magneto-optical recording medium, which were made in the manner described above, the bias magnetic field characteristics and the EWR characteristics were rated in the same manner as that in Example 4.

The results of the rating are shown in Table 8.

TABLE 8

| Sample | Content of residual hydrogen gas during the formation of the first protective dielectric layer (ppm) | Variations in bias magnetic field characteristics (Oe) | EWR characteristics (the C/H ratio after 100,000 cycles - the initial C/N ratio) (dB) |
| --- | --- | --- | --- |
| P | Higher than 10000 | 100–higher than 700 | More than −10 |
| Q | 5000–10000 | 100–700 | −5—10 |
| R | 2000–5000 | 100–700 | −5.0 |
| S | 1000–2000 | 100–500 | −5.0 |

I claim:

1. A magneto-optical recording medium at least comprising a transparent substrate and a recording layer which is overlaid at least on one surface of the transparent substrate, wherein said recording layer is formed by carrying out a sputtering process in an inert gas atmosphere, in which the content of residual hydrogen gas is not higher than 1,000 ppm with respect to the amount of an inert gas.

2. A magneto-optical recording medium as defined in claim 1 wherein said recording layer primarily contains an amorphous alloy, which is primarily constituted of at least one transition metal and at least one rare earth metal.

3. A magneto-optical recording medium as defined in claim 1 wherein a first protective dielectric layer, said recording layer, and a second protective dielectric layer are overlaid in this order on said transparent substrate.

4. A magneto-optical recording medium as defined in claim 1 wherein a first protective dielectric layer, said recording layer, a second protective dielectric layer, and a reflection metal layer 300 to 1000 Å thick are overlaid in this order on said transparent substrate.

5. A magneto-optical recording medium at least comprising a transparent substrate and a recording layer which is overlaid at least on one surface of the transparent substrate,
wherein said recording layer is formed by carrying out a sputtering process in an inert gas atmosphere, in which the content of residual hydrogen gas is not higher than 1,000 ppm with respect to the amount of an inert gas, and the content of residual nitrogen gas is not higher than 1,000 ppm with respect to the amount of the inert gas.

6. A magneto-optical recording medium as defined in claim 5 wherein said recording layer primarily contains an amorphous alloy, which is primarily constituted of at least one transition metal and at least one rare earth metal.

7. A magneto-optical recording medium as defined in claim 5 wherein a first protective dielectric layer, said recording layer, and a second protective dielectric layer are overlaid in this order on said transparent substrate.

8. A magneto-optical recording medium as defined in claim 5 wherein a first protective dielectric layer, said recording layer, a second protective dielectric layer, and a reflection metal layer 300 to 1000 Å thick are overlaid in this order on said transparent substrate.

9. A method for making a magneto-optical recording medium, which comprises the steps of:

i) keeping the content of residual hydrogen gas in a low-pressure inert gas atmosphere at a value, which is not higher than 1,000 ppm with respect to the amount of an inert gas, and
ii) sputtering at least one magnetic material from the corresponding magnetic material target to a transparent substrate in said low-pressure inert gas atmosphere, whereby a recording layer is formed on said transparent substrate.

10. A method as defined in claim 9 wherein said recording layer primarily contains an amorphous alloy, which is primarily constituted of at least one transition metal and at least one rare earth metal.

11. A method as defined in claim 9 wherein a first protective dielectric layer, said recording layer, and a second protective dielectric layer are overlaid in this order on said transparent substrate.

12. A method as defined in claim 9 wherein a first protective dielectric layer, said recording layer, a second protective dielectric layer, and a reflection metal layer 300 to 1000 Å thick are overlaid in this order on said transparent substrate.

13. A method for making a magneto-optical recording medium, which comprises the steps of:

i) keeping the content of residual hydrogen gas in a low-pressure inert gas atmosphere at a value, which is not higher than 1,000 ppm with respect to the amount of an inert gas,
ii) keeping the content of residual nitrogen gas in the low-pressure inert gas atmosphere at a value, which is not higher than 1,000 ppm with respect to the amount of the inert gas, and
iii) sputtering at least one magnetic material from the corresponding magnetic material target to a transparent substrate in said low-pressure inert gas atmosphere, whereby a recording layer is formed on said transparent substrate.

14. A method as defined in claim 13 wherein said recording layer primarily contains an amorphous alloy, which is primarily constituted of at least one transition metal and at least one rare earth metal.

15. A method as defined in claim 13 wherein a first protective dielectric layer, said recording layer, and a second protective dielectric layer are overlaid in this order on said transparent substrate.

16. A method as defined in claim 13 wherein a first protective dielectric layer, said recording layer, a second protective dielectric layer, and a reflection metal layer 300 to 1000 Å thick are overlaid in this order on said transparent substrate.

17. A magneto-optical recording medium comprising a transparent substrate and a magneto-optical recording film overlaid on the transparent substrate, the magneto-optical recording film being composed of at least a first protective dielectric layer, a recording layer, and a second protective dielectric layer, which are overlaid in this order on the transparent substrate,
wherein at least either one of said first protective dielectric layer and said second protective dielectric layer is formed by carrying out a sputtering process in an inert gas atmosphere, in which the content of residual hydrogen gas is not higher than 1,000 ppm with respect to the amount of an inert gas.

18. A magneto-optical recording medium as defined in claim 17 wherein said recording layer primarily contains an amorphous alloy, which is primarily constituted of at least one transition metal and at least one rare earth metal.

19. A magneto-optical recording medium as defined in claim 17 wherein a reflection metal layer 300 to 1000 Å thick is formed as a top layer of said magneto-optical recording film.

20. A method for making a magneto-optical recording medium, in which at least a recording layer and a protective dielectric layer are formed on a transparent substrate with a sputtering process,
wherein the improvement comprises the steps of, in the course of forming said protective dielectric layer:

i) keeping the content of residual hydrogen gas in a low-pressure inert gas atmosphere at a value, which is not higher than 1,000 ppm with respect to the amount of an inert gas, and
ii) sputtering a dielectric from a dielectric target to said transparent substrate in said low-pressure inert gas atmosphere by applying an electric power to said dielectric target, whereby a dielectric layer is formed on said transparent substrate.

21. A method as defined in claim 20 wherein said recording layer primarily contains an amorphous alloy, which is primarily constituted of at least one transition metal and at least one rare earth metal.

22. A method as defined in claim 20 wherein a reflection metal layer 300 to 1000 Å thick is formed as a top layer of said magneto-optical recording film.

* * * * *